(12) United States Patent
Bui et al.

(10) Patent No.: US 7,576,369 B2
(45) Date of Patent: Aug. 18, 2009

(54) DEEP DIFFUSED THIN PHOTODIODES

(75) Inventors: Peter Steven Bui, Westminster, CA (US); Narayan Dass Taneja, Long Beach, CA (US)

(73) Assignee: UDT Sensors, Inc., Hawthorne, CA (US)

( * ) Notice: Subject to any disclaimer, the term of this patent is extended or adjusted under 35 U.S.C. 154(b) by 433 days.

(21) Appl. No.: 11/258,848

(22) Filed: Oct. 25, 2005

(65) Prior Publication Data

US 2007/0090394 A1 Apr. 26, 2007

(51) Int. Cl.
*H01L 29/74* (2006.01)

(52) U.S. Cl. .............. 257/127; 257/184; 257/233; 257/292; 257/448; 257/E31.115

(58) Field of Classification Search ........... 257/233, 257/292, E33.054, E31.084, E31.099, E31.115, 257/E31.058, E33.076, 127, 184, 437, 443, 257/448, 461, E27.129

See application file for complete search history.

(56) References Cited

U.S. PATENT DOCUMENTS

| 3,041,226 A | 6/1962 | Pennington |
| 3,713,921 A | 1/1973 | Fleischer et al. |
| 3,765,969 A | 10/1973 | Kragness et al. |
| 3,801,390 A | 4/1974 | Lepselter et al. |
| 3,808,068 A | 4/1974 | Johnson et al. |
| 3,895,976 A | 7/1975 | Dumas |
| 4,210,923 A | 7/1980 | North et al. |
| 4,290,844 A | 9/1981 | Rotolante et al. |
| 4,874,939 A | 10/1989 | Nishimoto et al. |
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,049,962 A | 9/1991 | Huang et al. |
| 5,053,318 A | 10/1991 | Gulla et al. |
| 5,144,379 A | 9/1992 | Eshita et al. |

(Continued)

FOREIGN PATENT DOCUMENTS

EP 0 347 157 12/1989

(Continued)

OTHER PUBLICATIONS

Y. Atatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., vol. 31, pp. 2098-2100, 1995.

(Continued)

*Primary Examiner*—Sue Purvis
*Assistant Examiner*—Fazli Erdem
(74) *Attorney, Agent, or Firm*—Patentmetrix

(57) ABSTRACT

This invention comprises photodiodes, optionally organized in the form of an array, including p+ deep diffused regions or p+ and n+ deep diffused regions. More specifically, the invention permits one to fabricate thin 4 inch and 6 inch wafer using the physical support provided by a n+ deep diffused layer and/or p+ deep diffused layer. Consequently, the present invention delivers high device performances, such as low crosstalk, low radiation damage, high speed, low leakage dark current, and high speed, using a thin active layer.

6 Claims, 5 Drawing Sheets

U.S. PATENT DOCUMENTS

| | | | |
|---|---|---|---|
| 5,214,276 A | 5/1993 | Himoto et al. |
| 5,237,197 A | 8/1993 | Snoeys et al. |
| 5,252,142 A | 10/1993 | Matsuyama et al. |
| 5,254,480 A | 10/1993 | Tran |
| 5,276,955 A | 1/1994 | Noddin et al. |
| 5,408,122 A | 4/1995 | Reele |
| 5,414,295 A | 5/1995 | Le Roux et al. |
| 5,430,321 A | 7/1995 | Effelsberg |
| 5,446,308 A | 8/1995 | Piccone et al. |
| 5,446,751 A | 8/1995 | Wake |
| 5,501,990 A | 3/1996 | Holm et al. |
| 5,517,052 A | 5/1996 | Ishaque |
| 5,543,736 A | 8/1996 | Gardner et al. |
| 5,576,559 A | 11/1996 | Davis |
| 5,599,389 A | 2/1997 | Iwasaki |
| 5,656,508 A | 8/1997 | So et al. |
| 5,670,383 A | 9/1997 | Piccone et al. |
| 5,670,817 A | 9/1997 | Robinson |
| 5,777,352 A * | 7/1998 | Reele ..................... 257/184 |
| 5,818,096 A | 10/1998 | Ishibashi et al. |
| 5,825,047 A | 10/1998 | Ajisawa et al. |
| 5,869,834 A | 2/1999 | Wipenmyr |
| 5,880,482 A | 3/1999 | Adesida et al. |
| 5,889,313 A | 3/1999 | Parker |
| 5,923,720 A | 7/1999 | Barton et al. |
| 5,928,438 A | 7/1999 | Salami et al. |
| 6,027,956 A | 2/2000 | Irissou |
| 6,075,275 A | 6/2000 | Irissou |
| 6,169,319 B1 | 1/2001 | Malinovich et al. |
| 6,204,087 B1 * | 3/2001 | Parker et al. ............. 438/56 |
| 6,218,684 B1 | 4/2001 | Kuhara et al. |
| 6,218,704 B1 | 4/2001 | Brown et al. |
| 6,277,668 B1 | 8/2001 | Goossen et al. |
| 6,303,967 B1 | 10/2001 | Irissou |
| 6,326,300 B1 | 12/2001 | Liu et al. |
| 6,326,649 B1 | 12/2001 | Chang et al. |
| 6,352,517 B1 | 3/2002 | Flock et al. |
| 6,399,991 B1 | 6/2002 | Ando |
| 6,426,991 B1 | 7/2002 | Mattson et al. |
| 6,438,296 B1 | 8/2002 | Kongable |
| 6,458,619 B1 | 10/2002 | Irissou |
| 6,483,130 B1 | 11/2002 | Yang et al. |
| 6,489,635 B1 | 12/2002 | Sugg |
| 6,504,158 B2 | 1/2003 | Possin |
| 6,504,178 B2 | 1/2003 | Carlson et al. |
| 6,510,195 B1 | 1/2003 | Chappo et al. |
| 6,546,171 B2 | 4/2003 | Fukutomi |
| 6,569,700 B2 | 5/2003 | Yang |
| 6,593,636 B1 | 7/2003 | Bui et al. |
| 6,670,258 B2 | 12/2003 | Carlson et al. |
| 6,690,078 B1 | 2/2004 | Irissou et al. |
| 6,734,416 B2 | 5/2004 | Carlson et al. |
| 6,762,473 B1 | 7/2004 | Goushcha et al. |
| 6,772,729 B2 | 8/2004 | Brosseau et al. |
| 6,826,080 B2 | 11/2004 | Park et al. |
| 7,057,254 B2 | 6/2006 | Bui et al. |
| 7,112,465 B2 | 9/2006 | Goushcha et al. |
| 7,279,731 B1 | 9/2007 | Bui et al. |
| 2001/0034105 A1 | 10/2001 | Carlson |
| 2002/0056845 A1 | 5/2002 | Iguchi et al. |
| 2004/0104351 A1 | 6/2004 | Shibayama |
| 2004/0206886 A1 | 10/2004 | Carlson et al. |
| 2004/0222358 A1 | 11/2004 | Bui et al. |
| 2004/0241897 A1 | 12/2004 | Rhee et al. |
| 2004/0262652 A1 * | 12/2004 | Goushcha et al. ........... 257/292 |
| 2006/0220078 A1 | 10/2006 | Bui et al. |
| 2006/0255420 A1 | 11/2006 | Bui et al. |
| 2006/0278898 A1 | 12/2006 | Shibayama |
| 2007/0090394 A1 | 4/2007 | Bui et al. |
| 2007/0257329 A1 | 11/2007 | Bui et al. |
| 2007/0278534 A1 | 12/2007 | Bui et al. |
| 2007/0296005 A1 | 12/2007 | Bui et al. |
| 2008/0067622 A1 | 3/2008 | Bui et al. |
| 2008/0128846 A1 | 6/2008 | Bui et al. |
| 2008/0277753 A1 | 11/2008 | Bui et al. |

FOREIGN PATENT DOCUMENTS

| | | |
|---|---|---|
| EP | 0436282 | 7/1991 |
| EP | 0 723 301 A2 | 5/1997 |
| EP | 0 723 301 B1 | 7/2000 |
| EP | 1 069 626 A2 | 1/2001 |
| EP | 1 205 983 A1 | 5/2002 |
| WO | WO/00/52766 | 9/2000 |

OTHER PUBLICATIONS

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

* cited by examiner

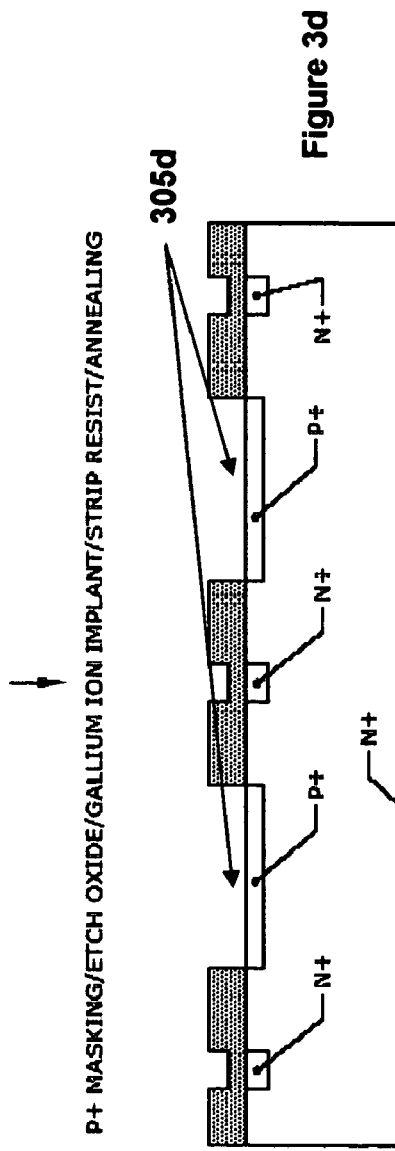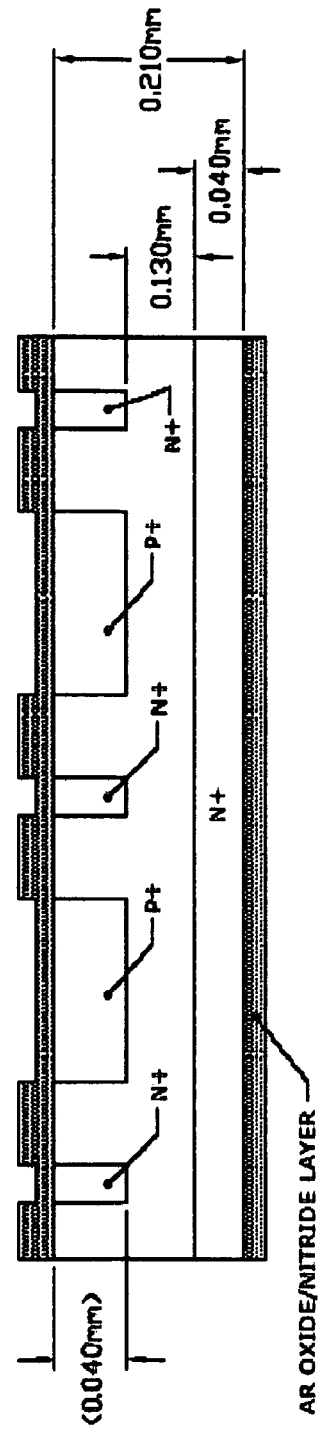

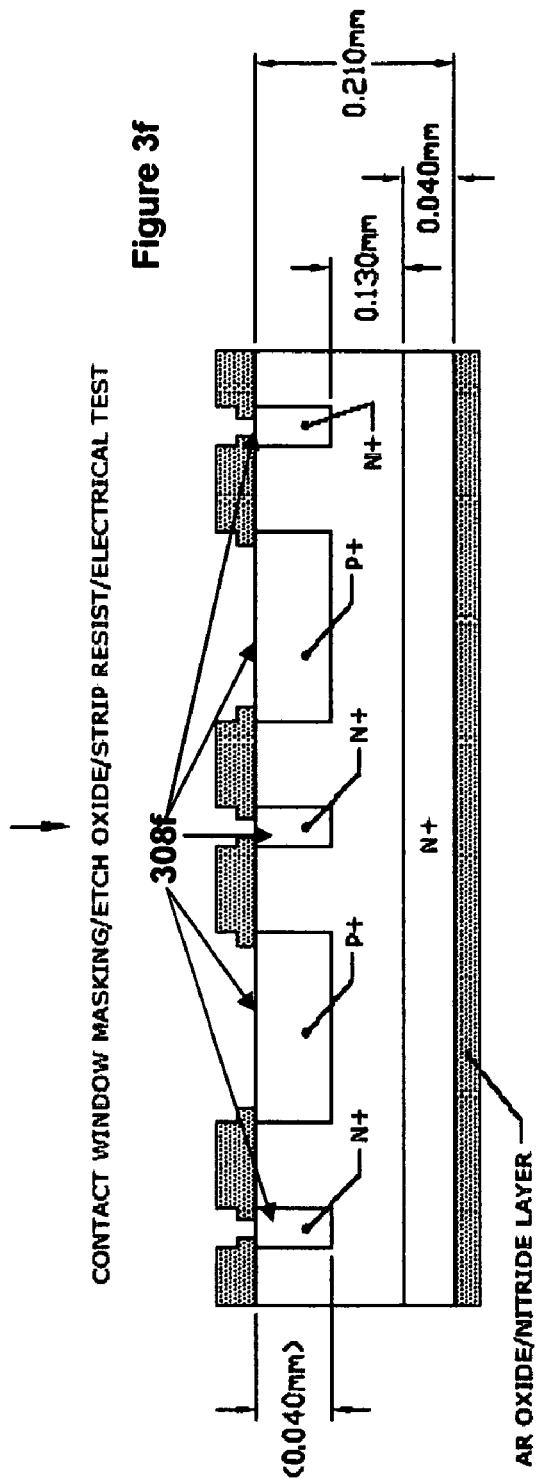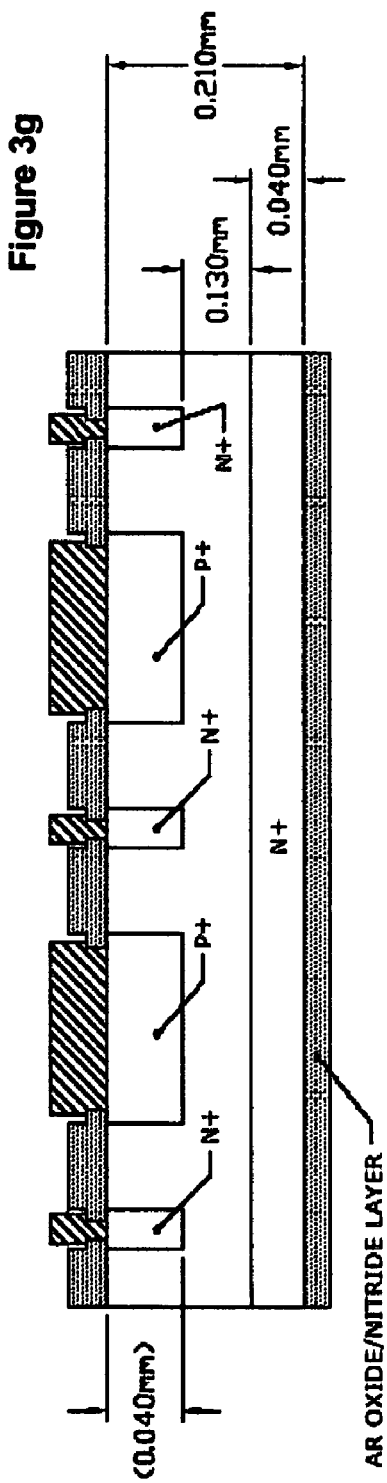

DEEP DIFFUSED THIN PHOTODIODES

FIELD OF THE INVENTION

The present invention is directed toward thin wafer photodiodes having improved strength and handling characteristics. Specifically, the present invention is directed towards novel photodiodes, applications using novel photodiodes and methods of making novel photodiodes having a deep diffused p+ region.

BACKGROUND OF THE INVENTION

Photodiodes comprise a plurality of electrode radiation-sensitive junctions formed in semiconductor material. Within a photodiode, charge carriers are created by light that illuminates the junction and reverse current is generated that varies with illumination. Photodiodes are used for detection of optical power and subsequent conversion of the same to electrical power. Operationally, photodiodes absorb charged particles, which facilitate detection of incident optical power, thereby generating current proportional to the incident power.

Photodiodes are typified by the quantification of certain characteristics, such as electrical, optical, current (I), voltage (V), and noise. Electrical characteristics predominantly include shunt resistance, series resistance, junction capacitance, rise or fall time and frequency response whereas optical characteristics include responsivity, quantum efficiency, non-uniformity, and non-linearity. Noise in photodiodes is generated by a plurality of sources including, but not limited to, thermal noise, quantum or photon or shot noise, and flicker noise.

In the semiconductor industry it is often desirable to increase light-induced current of photodiodes in order to increase the signal-to-noise ratio and thereby enhance photodiode sensitivity. Photodiode sensitivity is crucial in low light-level applications and is typically quantified by noise equivalent power (NEP) defined as the optical power that produces a signal-to-noise ratio of unity at the detector output. NEP is usually specified at a given wavelength and over a frequency bandwidth of 1 Hz and is therefore expressed in units of $W/Hz^{1/2}$.

Silicon photodiodes, essentially active solid-state semiconductor devices, are among the most popular photodetectors coalescing high performance over a wide wavelength range with unmatched user-friendliness. For example, silicon photodiodes are sensitive to light in the wide spectral range, approximately $200*10^{-9}$ m to $1200*10^{-9}$ m, extending from deep ultraviolet all the way through visible to near infrared. Additionally, silicon photodiodes detect the presence or absence of minute light intensities thereby facilitating extremely precise measurement of the same on appropriate calibration. For instance, appropriately calibrated silicon photodiodes detect and measure light intensities varying over a wide range, from very minute light intensities of below $10^{-13}$ watts/cm$^2$ to high intensities above $10^{-3}$ watts/cm$^2$.

Silicon photodiodes can be employed in an assortment of applications including, but not limited to, spectroscopy, distance and speed measurement, laser ranging, laser guided missiles, laser alignment and control systems, optical free air communication, optical radar, radiation detection, optical position encoding, film processing, flame monitoring, scintillator read out, environmental applications such as spectral monitoring of earth ozone layer and pollution monitoring, low light-level imaging, such as night photography, nuclear medical imaging, photon medical imaging, and multi-slice computer tomography (CT) imaging, and thin wafer applications.

Nonetheless, numerous problems exist with existing photodiodes. Specifically, generating thin wafer photodiodes in which leakage current and noise is controlled but the wafer is sufficiently sturdy to handle processing and use is difficult. Popular applications including, but not limited to, computer tomography (CT), utilize thin wafer photodiode arrays produced on large diameter wafers. The production of such arrays is often plagued by excessive loss due to breakage of the delicate thin wafers.

Various approaches have been made in the prior art to manufacture semiconductor devices on large diameter wafers. Japan Patent Application No. JP-A 2004200305 titled "METHOD OF MANUFACTURING SOI WAFER HAVING DIAMETER OF SIX INCHES OR MORE" to Takahashi Yoshiki et al. uncovers a method by which an SOI wafer, the whole diameter of which can be used as a device forming area, and can be manufactured without increasing the manufacturing cost nor lowering the productivity.

U.S. Pat. No. 6,537,418 titled "Spatially uniform gas supply and pump configuration for large wafer diameters" to Muller, K. Paul et al. by and large relates to semiconductor wafer etching and more specifically to an improved gas distribution plate which substantially reduces the non-uniformities in the etch process that occurs across the semiconductor wafer.

Europe Patent Application No. EP-A 1308000544 titled "SILICON SINGLE CRYSTAL WAFER HAVING VOID DENUDED ZONE ON THE SURFACE AND DIAMETER OF ABOVE 300 mm AND ITS PRODUCTION METHOD" to IIDA, M. et al. relates to a silicon single crystal wafer having a diameter of 300 mm or more and a defect-free layer and a method for producing the same.

The prior art fails to provide a thin wafer photodiode structure and method of manufacturing that produces sufficiently sturdy wafers while still maintaining the overall performance characteristics of photodiode arrays and their individual diode units, within detection systems.

Consequently, there is still a need for economically, technically, and operationally feasible methods, apparatuses, and systems for manufacturing thin wafer photodiode arrays. More exclusively, there is demand for cost-effective computer tomography (CT) scanner photodiode array while still maintaining the overall performance characteristics of the photodiode array and individual diode units.

SUMMARY OF THE INVENTION

The invention described herein comprises a plurality of photodiodes, optionally organized in the form of an array, including p+ deep diffused regions or p+ and n+ deep diffused regions. More specifically, the present invention permits one to fabricate thin 4 inch and 6 inch wafer using the physical support provided by a n+ deep diffused layer and/or p+ deep diffused layer. Consequently, the present invention delivers high device performances, such as low crosstalk, low radiation damage, high speed, low leakage dark current, and high speed, using a thin active layer.

More particularly, the current invention is a photodiode array having a substrate with at least a front side, and a back side and a plurality of photodiodes integrally formed in the substrate forming the array. Starting from the front side, each photodiode has a passivation layer comprising, for example, $SiO_2/Si_3N_4$, and an active high resistivity layer comprising, for example, n-type silicon. The active high resistivity layer comprises at least five regions of alternating conductivity type. In one embodiment, the active high resistivity layer comprises a) a first n+ region adjacent to b) a first deep diffused p+ region adjacent to c) a second n+ region adjacent to b) a second deep diffused p+ region adjacent to a) a third n+ region. In a second embodiment, the active high resistivity layer comprises a) a first deep diffused n+ region adjacent to b) a first deep diffused p+ region adjacent to c) a second deep diffused n+ region adjacent to b) a second deep diffused p+ region adjacent to a) a third deep diffused n+ region.

In one embodiment, the present invention comprise a photodiode comprising a substrate with at least a front side and a back side; a passivation layer proximate to the front side; an active high resistivity layer proximate to said passivation layer comprising at least five regions of alternating conductivity type; an n+ deep drive in layer proximate to the active high resistivity layer; an anti-reflective layer proximate to said n+ deep drive in layer; and a plurality of contact electrodes in electrical communication with each of said five regions of alternating conductivity type.

Optionally, the photodiode's passivation layer comprises $SiO_2/Si_3N_4$, the high resistivity layer comprises n-type silicon, the high resistivity layer comprises a thickness of approximately 130 μm, or the high resistivity layer is approximately 10 μm. Optionally, the five regions of alternating conductivity type comprises a first n+ region adjacent to a first deep diffused p+ region adjacent to a second n+ region adjacent to a second deep diffused p+ region adjacent to a third n+ region. Optionally, the photodiode has five regions of alternating conductivity type with a thickness of approximately 40 μm and the n+ deep drive in layer comprises a thickness of approximately 40 μm.

Optionally, the five regions of alternating conductivity type comprises a first deep diffused n+ region adjacent to a first deep diffused p+ region adjacent to a second deep diffused n+ region adjacent to a second deep diffused p+ region adjacent to a third deep diffused n+ region, the five regions of alternating conductivity type comprise a thickness of approximately 140 μm to 200 μm, the n+ deep drive in layer comprises a thickness of approximately 0.5 μm, the n+ deep drive-in layer comprises a n+ concentration of approximately $10^{16}$, or the n+ deep drive-in layer comprises a n+ concentration of approximately $10^{16}$ to $10^{19}$. The present invention further includes photodiode arrays comprising any of the photodiodes described above or a computed tomography system comprising any of the photodiodes described above.

BRIEF DESCRIPTION OF THE DRAWINGS

These and other features and advantages of the present invention will be appreciated, as they become better understood by reference to the following detailed description when considered in connection with the accompanying drawings:

FIGS. 3a-3g are a series of cross sectional schematic views of how the novel photodiodes of the present invention is manufactured.

DETAILED DESCRIPTION OF THE INVENTION

Figure 1:
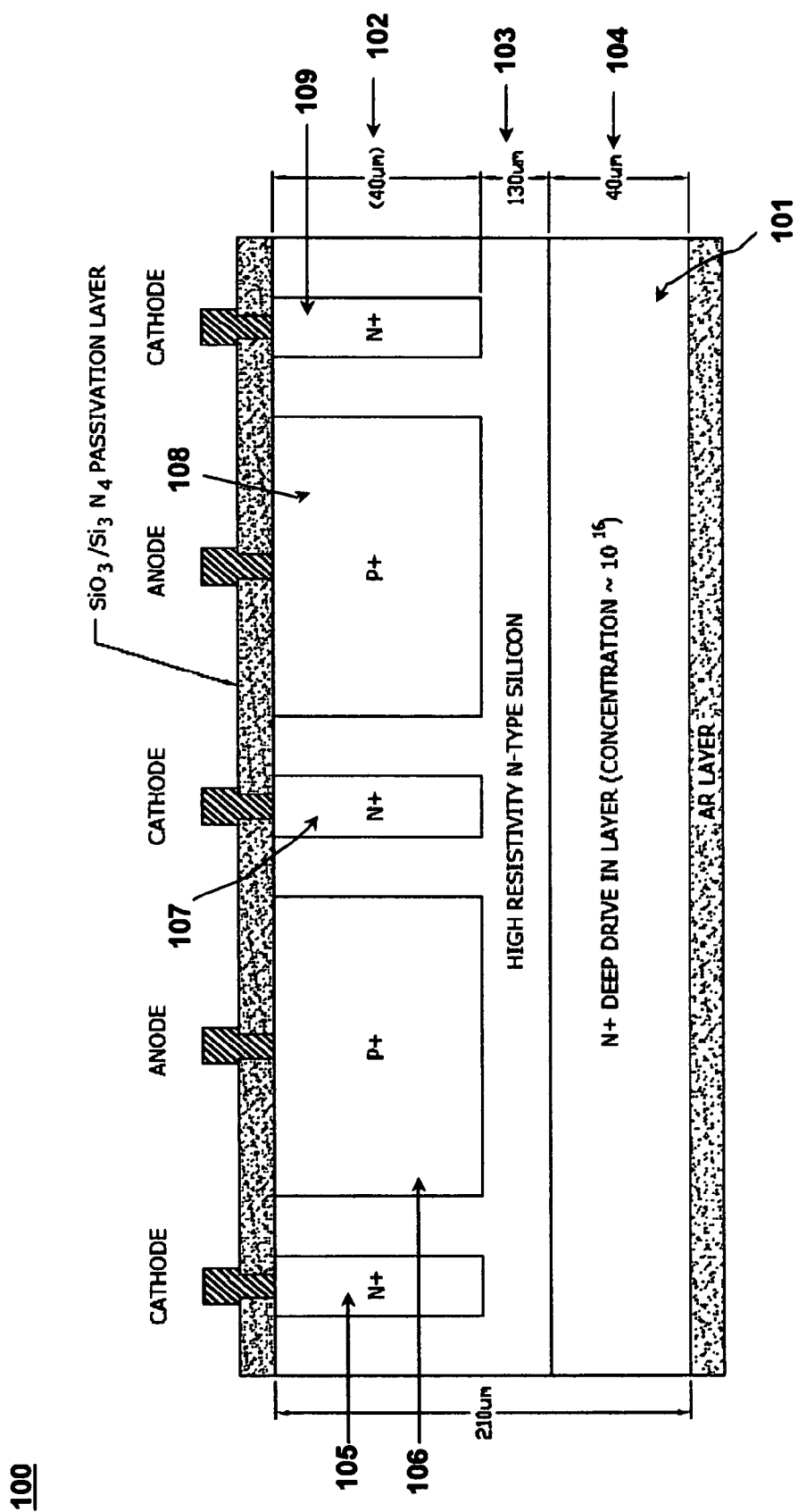
FIG. 1 is a cross sectional schematic view of one embodiment of a novel photodiode.

The invention described herein comprises a plurality of photodiodes, optionally organized in the form of an array, including p+ deep diffused regions or p+ and n+ deep diffused regions. The photodiode arrays have an assortment of beneficial performance characteristics, including, but not limited to, low cost, being economically, technically, and operationally feasible, having high sensivity with low cross talk, and use of reasonably thin, large diameter wafers.

More particularly, the current invention is a photodiode array having a substrate with at least a front side, and a back side and a plurality of photodiodes integrally formed in the substrate forming the array. Starting from the front side, each photodiode has a passivation layer comprising, for example, $SiO_2/Si_3N_4$, and an active high resistivity layer comprising, for example, n-type silicon. The active high resistivity layer comprises at least five regions of alternating conductivity type. In one embodiment, the active high resistivity layer comprises a) a first n+ region adjacent to b) a first deep diffused p+ region adjacent to c) a second n+ region adjacent to b) a second deep diffused p+ region adjacent to a) a third n+ region. In a second embodiment, the active high resistivity layer comprises a) a first deep diffused n+ region adjacent to b) a first deep diffused p+ region adjacent to c) a second deep diffused n+ region adjacent to b) a second deep diffused p+ region adjacent to a) a third deep diffused n+ region.

Below the active high resistivity layer is a deep drive in layer, comprising, for example, n+ at a concentration of approximately $10^{16}$ in one embodiment and $10^{16}$ to $10^{19}$ in a second embodiment. Below the deep drive in layer is an anti-reflective layer. A plurality of contact electrodes, namely anodes and cathodes, are positioned in precise locations on front side within the passivation layer.

The fabrication of the novel photodiode array involves diffusion processes, such as p+ and n+ respectively, in which n+ diffusion comprises the steps of applying an n+ mask on front side; etching oxide; stripping resist; and n+ diffusion and in which p+ diffusion comprises steps of applying a p+ mask; etching oxide; either p+ dopant ion implantation or p+ diffusion; and annealing. Once complete, the junction is driven deep into the substrate thereby yielding an active high resistivity layer of approximately 130 μm to 200 μm, depending on the precise embodiment.

The present invention is directed towards a detector structure, detector arrays, and design and fabrication of photodiode arrays for an assortment of applications including, but not limited to, computerized tomography applications and other thin wafer applications. Various modifications to the preferred embodiment will be readily apparent to those of ordinary skill in the art, and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

The present invention comprises several embodiments that provide for lesser susceptibility to cross talk effects, less radiation damage, and high-speed application. In one embodiment, the present invention comprises a photodiode array with deep diffused, such as p+ or p+ and n+, or sinker regions. A surface passivation layer, together with a high resistivity layer, further helps minimize cross talk between adjacent diode elements. In one embodiment, the passivating layer consists of apposite material selected from the group including, but not limited to, silicon oxide, silicon nitride, silicon oxynitride or a layered combination of the aforementioned materials. The photodiodes with deep diffused or sinker regions are implemented in an array and have superior performance characteristics, including high-speed due to low transit time, less radiation damage, and low capacitance, and low cross talk resulting from the use of a thin high resistivity active layer. A person of ordinary skill in the art would appreciate the fact that within the range of practical doping levels, cross talk is roughly 3 dB lower for the highest resistivity, thin active layers than for the high resistivity, thick active layers.

Referring now to FIG. 1, a cross-sectional view depicts a photodiode 100 comprising regions, such as those of first 102, second 103, and third 104. In one embodiment, the three regions may preferably possess the following specifications: the thickness of the first region 102 is approximately 40 μm, the thickness of the second region 103 is approximately 130 μm, and the thickness of the third region 104 is approximately 40 μm. The above-mentioned specifications have only been mentioned by way of illustration and are not binding. These specifications can be easily changed to suit varying design, fabrication, and functional requirements suggested herein. Persons of ordinary skill in the art would appreciate that the number of photodiodes incorporated in the semiconductor device or photodiode chip is not limited to a specific number.

The first region 102 comprises a plurality of alternating heavily doped regions doped with apposite impurities, possessing first and second selected conductivity types. For instance, and by no way of limitation, one embodiment comprises at least five alternating heavily doped regions grouped into two categories. The first category, comprising heavily doped regions 105, 107, and 109 respectively, is doped with a suitable impurity of a first selected conductivity type, such as p-type or n-type. The second category, comprising heavily doped regions 106 and 108 correspondingly, is doped with an impurity that yields a conductivity type in opposition to the first selected conductivity type. For example, but not limited to such example, if the first category of regions is doped with a suitable impurity of selected conductivity that is n+ type, then second category of regions is doped with p+ type.

In one embodiment, regions 106 and 108 are deep diffused p+ regions while regions 105, 107, 109 are n+ type. As is discussed in further detailed below, although boron (B) or any other p-type dopant can be used to create the p+ regions, it is preferred that a dopant with higher diffusion coefficient such as gallium (Ga) be employed herein.

The second region 103 comprises an active high resistivity layer. High resistivity layer may be doped with a suitable material of selected conductivity type, such as p-type or n-type. For example, and by no way of limitation, use of high resistivity n-type silicon is preferred. The active layer possesses high resistivity and thus low conductivity. This high resistivity layer serves as a means of device isolation and passivation.

Furthermore, experience with the use of thin high-resistivity n-type silicon in the manufacture of radiation detectors for high-energy physics experiments suggests that devices fabricated using this material are fully depleted at low bias voltage and thus are more resistant to radiation.

Yet another third region 104 comprises deep drive in layer 101 heavily doped with an apt dopant of selected conductivity type, such as p-type or n-type. The dopant used herein is preferably, but by no way limitation, n+ type concentration of whose is in the order of $10^{16}$.

Figure 2:
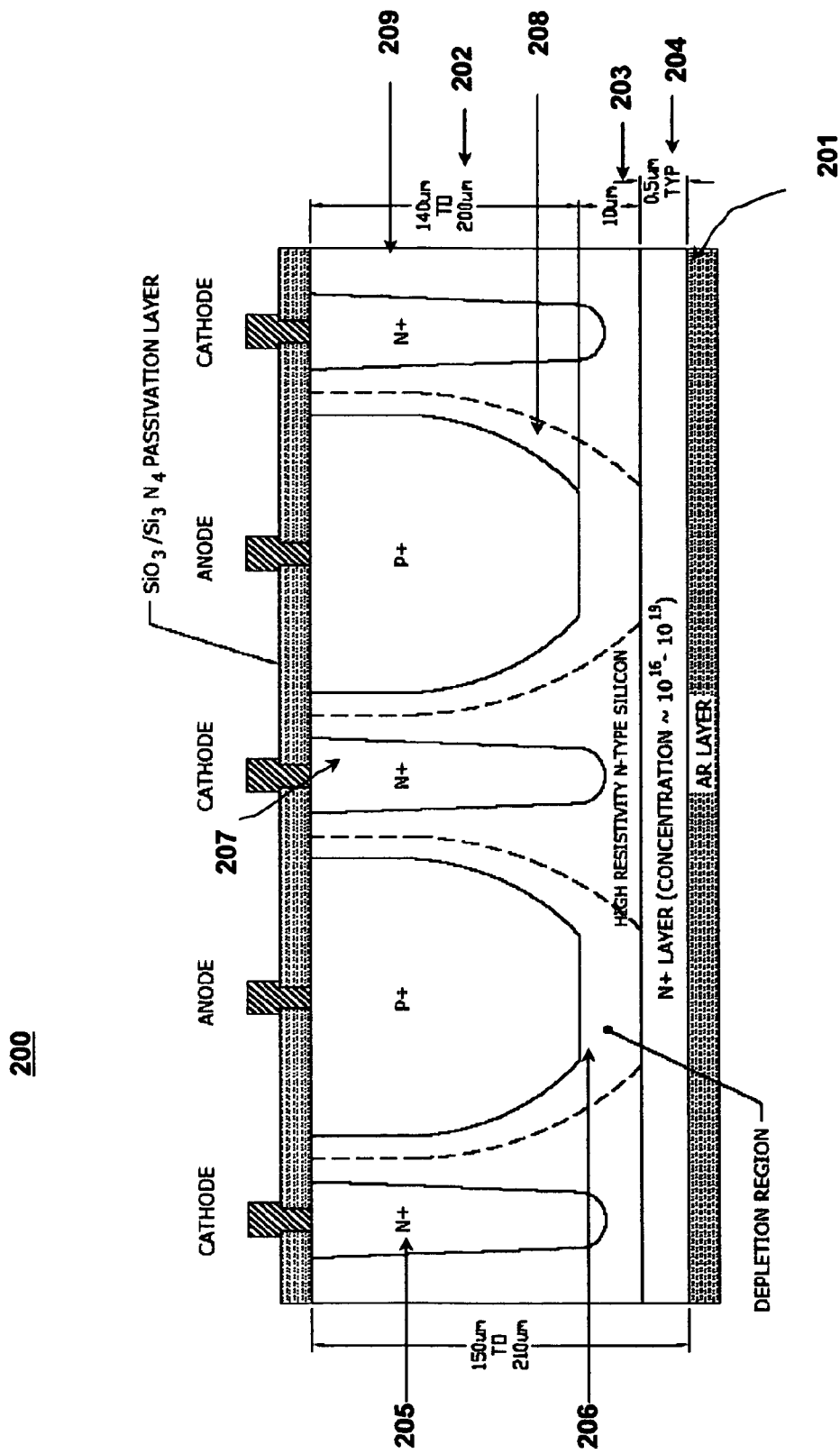
FIG. 2 is a cross sectional schematic view of another embodiment of a novel photodiode with a depletion region further shown.

Referring to FIG. 2, a second embodiment of the present invention is shown. Photodiode array 200 comprises regions, such as those of first 202, second 203, and third 204. In one embodiment, the three regions possesses the following specifications: the thickness of the first region 202 is approximately 140-200 μm, the thickness of the second region 203 is approximately 10 μm, and the thickness of the third region 204 is approximately 0.5 μm. The wafer thickness, in its entirety, is in the order of 151 μm (representing a 4 inch wafer) to 211 μm (representing a 6 inch wafer).

The first region 202 comprises a plurality of alternating heavily doped regions doped with opposite impurities, possessing first and second selected conductivity types. For instance, and by no way of limitation, one embodiment comprises at least five alternating heavily doped regions grouped into two categories. The first category, comprising heavily doped regions 205, 207, and 209 respectively, is doped with a suitable impurity of a first selected conductivity type, such as p-type or n-type. The second category, comprising heavily doped regions 206 and 208 correspondingly, is doped with an impurity that yields a conductivity type in opposition to the first selected conductivity type. For example, but not limited to such example, if the first category of regions is doped with a suitable impurity of selected conductivity that is n+ type, then second category of regions is doped with p+ type.

In one embodiment, regions 206 and 208 are deep diffused p+ regions while regions 205, 207, 209 are n+ type. As is discussed in further detailed below, although boron (B) or any other p-type dopant can be used to create the p+ regions, it is preferred that a dopant with higher diffusion coefficient such as gallium (Ga) be employed herein.

The second region 203 comprises an active high resistivity layer. High resistivity layer may be doped with a suitable material of selected conductivity type, such as p-type or n-type. For example, and by no way of limitation, use of high resistivity n-type silicon is preferred. The active layer possesses high resistivity and thus low conductivity. This high resistivity layer serves as a means of device isolation and passivation.

Yet another third region 204 comprises a shallow layer 201 heavily doped with an apt dopant of selected conductivity type, such as p-type or n-type. The dopant used herein is preferably, but by no way limitation, n+ type concentration of whose is in the order of $10^{16}$ to $10^{19}$.

The process of manufacturing the novel photodiodes of the present invention is illustrated with accompanied drawings as depicted in FIGS. 3a-3g.

Figure 3A:
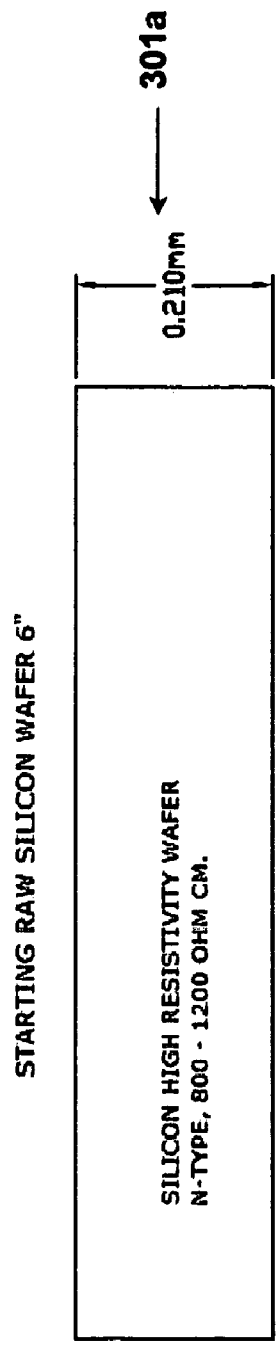
Figure 3B:
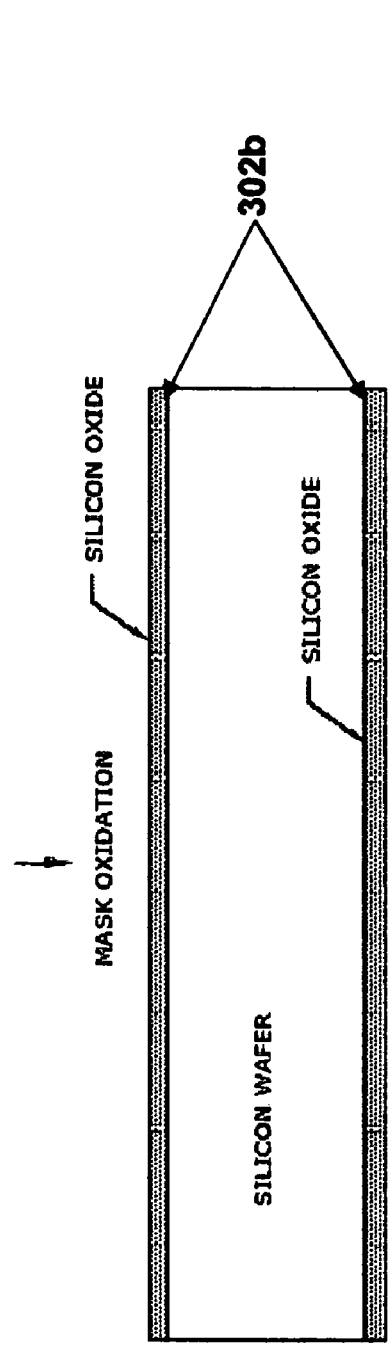

Referring to FIG. 3a, a start material of the photodiode array is depicted. The start material may be a round sliced wafer made of a suitable semiconductor material. For example, and by no way of limitation, silicon may be utilized in accordance with the principles of the present invention.

In one embodiment, wafer or semiconductor device 301a possesses the following specifications: diameter is 6 inches, thickness is 0.210 mm, conductivity is n-type, and resistivity is 800-1200 Ωcm respectively. The above specifications are merely for the purposes of illustration, and are not limiting. Consequently these specifications may be modified to suit the design, fabrication and functional requirements suggested herein. In another embodiment, the wafer or semiconductor device 301a is 8 inches in diameter. In yet another embodiment, the wafer 301a is 12 inches in diameter.

A wafer, if unpolished, can have a rough texture and may not exactly conform to parameters, such as surface flatness and thickness specifications. Therefore, it is preferred that the wafer 301a has a double-side polish. Additionally, before further fabrication steps are taken, the polished wafer 301a is subjected to a standard mask oxidation process that results in layers 302b of silicon oxide on both front and back surfaces of the wafer 301a. The tasks of polishing and standard mask oxidation are known to those of ordinary skill in the art having the benefit of this disclosure and, consequently, will not be further detailed herein.

Figure 3C:
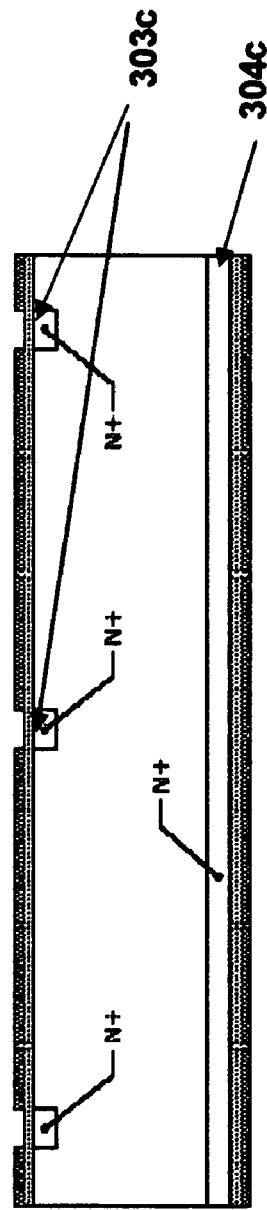

After the task of initial mask oxidation has been performed, regions, 303c on the front side of wafer 301a is subjected to n+ masking and diffusion of n+ dopant, as shown in FIG. 3c. Region 304c on the back side of wafer 301a is subjected to n+ masking and diffusion of n+ dopant. Prior to n+ diffusion on both the front and back surfaces of the wafer 301a, selective etching of the silicon oxide layer is performed to retain the silicon oxide layer in certain regions.

N+ masking preferably involves the following steps: first a photographic mask, possessing the desired pattern or grid, is produced. In general, photomasks are high precision plates containing microscopic images of preferred electronic circuits. They are made from flat pieces of quartz or glass with a layer of chrome on one side. Etched in chrome layer is a portion of desired electronic circuit design. This circuit design on the mask is also called geometry.

More specifically, n+ mask (pattern or grids) possess a tightly coupled architecture, thereby facilitating better geometry for a sensor array, wherein dies are arranged in rows and columns on the mask, to be implanted on a wafer. For instance, this may typically be a chromium pattern produced on a glass plate in accordance with the principles of the present invention. This involves preparation of initial artwork, i.e. photolithographic n+ mask of chromium on a glass plate. The present invention includes the design of other practically appropriate patterns, without departing from the spirit and scope of the invention. Since persons of ordinary skill are familiar with methods of producing photographic masks possessing variety of patterns, this has not been further detailed herein.

As with any conventional masking techniques, n+ masking is used to protect one area of the wafer 301a while working on another. In general, this process is referred to as photolithography or photo-masking. Once the task of producing the photographic mask, possessing the desired n+ mask pattern or grid is complete, the wafer 301a is coated on its front side with a polymer called a photoresist or sometimes simply resist, sensitive to ultraviolet light, thereby rendering the wafer 301a characteristics similar to a piece of photographic paper.

A photo aligner aligns the wafer 301a to the n+ mask and then projects an intense light, such as ultraviolet light, through the mask and through a series of reducing lenses exposing the photoresist with the mask pattern. The n+ mask, like other masks, allows selective irradiation of photoresist on the wafer 301a thereby blocking irradiation in selected areas. The wafer 301a is then developed (the exposed photoresist removed) and baked to harden the remaining n+ mask type photoresist pattern. It is then exposed to a suitable chemical solution or plasma (gas discharge) so that areas not covered by the hardened photoresist are etched away. Further, the photoresist is removed using additional chemical or plasma and the wafer 300a is inspected to ensure the pattern (or image) transfer from the mask to the top photoresist layer is correct.

There are two types of photoresist, termed positive and negative. Where ultraviolet light strikes a positive resist, it weakens the polymer, such that, when the image is developed, the resist is washed away in areas exposed to the light, thereby transferring a positive image of the mask to the resist layer. The opposite occurs with a negative resist. Where ultraviolet light strikes a negative resist it strengthens the polymer, such that, when developed, the resist that was not exposed to ultraviolet light is washed away. The above discussion is aimed towards providing methods of masking and etching under conventional photolithographic techniques, which are merely for illustrative purposes, and in no way limits the scope of the invention.

Subsequently, regions 303c constituting part of n+ top cathodes, yet to be formed, are subjected to n+ diffusion. There are many different approaches available in the prior art to carry out this diffusion process and the choice of the diffusion method is dependent on various factors, such as diffusion coefficient of dopant, permissible error in diffusion depth, and diffusion source. Within the same step, prior to n+ diffusion on back side of wafer 301a, silicon oxide layer is totally etched.

Classically, ion implantation is a material engineering process by which ions of a material can be implanted into another solid, thereby changing the physical properties of the solid. Ion implantation is used in semiconductor device fabrication and in metal finishing, as well as various applications in materials science research. The ions introduce both a chemical change in the target, in that they can be a different element than the target, and a structural change, in that the crystal structure of the target can be damaged or even destroyed.

Further, ion implantation equipment typically consists of an ionization chamber, where ions of the desired element are produced, an accelerator, where the ions are electrostatically accelerated to a high energy, and a target chamber, where the ions impinge on a target, which is the material to be implanted. Each ion is typically a single atom, and thus the actual amount of material, referred to as the dose, implanted in the target is the integral over time of the ion current. The currents supplied by implanters are typically small (microamperes), and thus the dose which can be implanted in a reasonable amount of time is small.

Typical ion energies are in the range of 10 to 500 keV (1,600 to 80,000 aJ). Energies in the range 1 to 10 keV (160 to 1,600 aJ) can be used, but result in a penetration of only a few nanometers or less. Energies lower than this result in very little damage to the target, and fall under the designation ion beam deposition. Higher energies can also be used: accelerators capable of 5 MeV (800,000 aJ) are common. However, there is often great structural damage to the target, and because the depth distribution is broad, the net composition change at any point in the target will be small.

The energy of the ions, as well as the ion species and the composition of the target determine the depth of penetration of the ions in the solid: A monoenergetic ion beam will generally have a broad depth distribution. The average penetration depth is called the range of the ions. Under typical circumstances ion ranges will be between 10 nanometers and 1 micrometer. Thus, ion implantation is especially useful in cases where the chemical or structural change is desired to be near the surface of the target. Ions gradually lose their energy as they travel through the solid, both from occasional collisions with target atoms (which cause abrupt energy transfers) and from a mild drag from overlap of electron orbitals, which is a continuous process. The loss of ion energy in the target is called stopping.

Prior to performance of selective ion implantation, i.e. implantations executed merely into specific areas, a suitable layer of masking material must be deposited onto the wafer 301a surface. Photoresist materials are most frequently used due to their ease of application and patterning at low temperatures. Nevertheless, other masking materials, including but not limited to, silicon dioxide, can be used. For instance, and by no way limitation, one masking material employed herein is silicon dioxide. A main function of any masking layer is to prevent the dopant ions from penetrating through silicon wafer 301a.

Further, the thickness of masking layer should be within acceptable limits. These limits depend on certain parameters, for instance, energy of bombarding ions, and type of ions being used. The smaller, lighter ions tend to penetrate further into the masking layer than the larger, heavier ions. This means that boron will penetrate deeper than phosphorous which in turn will penetrate deeper than arsenic. Boron therefore requires a thicker mask than phosphorus and phosphorus thicker than arsenic. More specifically, typical thicknesses for a 200 keV acceleration energy are as follows: Boron (B) @ 0.8 mm, Phosphorus (P) @ 0.48 mm, and Arsenic (As) @ 0.48 mm, etc. For instance, and by no way of restriction, although Boron (B) or any other p-type dopant can be used it is preferred that any dopant with higher diffusion coefficient, such as Gallium (Ga), may be employed herein. It should be noted, however, that utilization of Ga as a preferred dopant for ion implantation is not obligatory and that any type of material possessing higher diffusion coefficient can be easily employed to suit the design, fabrication and functional requirements suggested herein.

In one embodiment, regions 305d, which constitute portions of the p+ anodes that are yet to be formed, are formed on the front side of wafer 301a as shown in FIG. 3d. Wafer 301a, coated with the silicon oxide layer, is subjected to selective etching utilizing a p+ mask to ensure certain regions retain the silicon oxide layer. This is achieved using any suitable masking technique including, but not limited to, p+ masking, followed by selective etching.

P+ masking is used and preferably involves the following steps. First, a photographic mask, possessing the desired pattern or grid, is produced. In general, photomasks are high precision plates containing microscopic images of electronic circuits or desired pattern. They are made from flat pieces of quartz or glass with a layer of chrome on one side. Etched in the chrome is a portion of an electronic circuit or design. The circuit or design on the mask is also referred to as the geometry of the mask.

More specifically, p+ masks of desired or requisite form are pre-formed for implantation on a wafer. For example, this may typically be a chromium pattern produced on a glass plate in accordance with the principles of the present invention. Other practically appropriate patterns and masking techniques could be used in the present invention without departing from the spirit and scope of the invention.

In one embodiment, subsequent to p+ masking and etching, wafer 301a is preferably caused to undergo selective ion implantation utilizing an appropriate dopant, as shown in FIG. 3e. For instance, and by no way of restriction, although Boron (B) or any other p-type dopant can be used it is preferred that any dopant with higher diffusion coefficient, such as Gallium (Ga), may be employed herein. It should be noted, however, that utilization of Ga as a preferred dopant for ion implantation is not obligatory and that any type of material possessing higher diffusion coefficient can be employed to suit the design, fabrication and functional requirements suggested herein.

Precise control of variations in dose, acceleration energy, and ion beam current is preferred to achieve the requisite dopant depth and profile. The resist surface, however, hardens during the implant process, making the resist film difficult to remove. For instance, ion implantations such as those possessing following specifications, i.e. implant doses greater than $1 \times 10^{15}$ atoms/cm$^2$, and energies greater than 50 keV, etc., accelerate the formation of carbonized skin on top of the resist. Higher implant energies and currents as well as increasing resist coverage make removal even harder.

Problems associated with implanted resist removal using conventional oxygen/nitrogen chemistry include long process times, resist popping, oxide residues, and unashed resist fragments. Fluorinated chemistry, a common solution to some of these problems, generates additional difficulties such as lifting and oxide loss. Other processing alternatives require expensive pretreatment or post treatment processes and can even damage the wafer. As a result, innovative, cost-effective techniques are needed to process clean, damage-free wafers with acceptable oxide loss.

Silicon surfaces, when exposed to oxygen, undergoes oxidation, thereby resulting in formation of a layer of silicon oxide, frequently known as silicon dioxide ($SiO_2$). By virtue of its properties, native silicon dioxide serves plurality of purposes, for instance as high-quality electrical insulator thereby facilitating electrical isolation of semiconductor devices, as barrier material during impurity implants or diffusion, as a component in MOS transistors, or as an interlayer dielectric in multilevel metallization structures, such as multichip modules.

Thermal oxidation of $SiO_2$ consists of exposing silicon substrate to an oxidizing environment of $O_2$ or $H_2O$ at elevated temperature, producing oxide films whose thicknesses range from 60 to 10000 angstroms. Oxidation of silicon is not difficult, since silicon has a natural inclination to form a stable oxide even at room temperature, as long as an oxidizing ambient is present. The elevated temperature used in thermal oxidation therefore serves primarily as an accelerator of the oxidation process, resulting in thicker oxide layers per unit of time.

More particularly, thermal oxidation is accomplished using an oxidation furnace (or diffusion furnace, since oxidation is basically a diffusion process involving oxidant species), which provides heat needed to elevate oxidizing ambient temperature. A furnace typically consists of following: a cabinet, a heating system, a temperature measurement and control system, fused quartz process tubes where wafers undergo oxidation, a system for moving process gases into and out of process tubes, and a loading station used for loading (or unloading) wafers into (or from) the process tubes. Depending on which oxidant species is used ($O_2$ or $H_2O$), the thermal oxidation of $SiO_2$ may either be in the form of dry oxidation (wherein the oxidant is $O_2$) or wet oxidation (wherein the oxidant is $H_2O$).

In the course of forming an oxide layer step, an anti-reflective (AR) layer is grown on the front and back sides of wafer 301a. Subsequently, wafer 301a is subjected to high temperature p+ and n+ deep drive oxidation.

Diffusion in semiconductor fabrication process is performed to convert exposed (not covered by silicon dioxide barrier layer) p-type silicon wafer into n-type material or vice versa. Two-step diffusion processes are known in the art and comprise an initial pre-deposition step with a source of dopant supplied to a wafer surface, followed by a drive-in oxidation step to drive the dopant deeper into the wafer, while preventing additional dopant entering wafer surface. In one example, a high purity nitrogen gas constantly purges the furnace to prevent unnecessary oxidation growth on the silicon wafer. In the pre-deposition process, a solid-state phosphorus source and two silicon wafers are loaded into furnace at 600° C. The furnace temperature is increased to 810° C. and the pre-deposition process is performed for forty-five minutes. After forty-five minutes, the furnace temperature is decreased to 600° C. and the phosphorus source is exposed. The furnace temperature is then increased to 1100° C. and the drive-in process is performed for sixty-five minutes. The furnace temperature is then decreased to 600° C. and the silicon wafers are unloaded.

In one embodiment, once the p+ and n+ diffusion is completed the junction is driven deeper into silicon wafer 301a, thereby yielding an active high resistivity layer of approximately 130 μm. Persons of ordinary skill in this art would appreciate the fact that this is substantially the same thickness that is available on 4" diameter wafers.

Referring to FIG. 3f, contact window masking is performed. A contact window is an aperture in a surface passivation layer through which device metallization makes contact with circuit elements. In photoresist contact window masking, a mask of desired pattern is preferably made on a quartz, chrome or glass plate. A mask is placed directly in contact with substrate and a light source is used to expose the photoresist. After development, a positive or negative image is created in the photoresist. A photomask is positioned over a photoresist and subjected to ultra-violet light, which exposes the areas not shielded by the mask. Areas exposed to ultra-violet radiation are hardened, but the areas required for diffusion are shielded by the mask and remain unaffected and are easily removed. Etching removes silicon dioxide. For instance, plasma etching is an advanced dry-etching process yielding even finer patterns than wet etching. It also offers greater safety, as large quantities of corrosive acids are not required. Within reaction chamber wafers lie directly in plasma glow discharge, where reactive ions are accelerated towards unmasked areas of wafer by radio frequency. The photoresist is stripped away to leave defined silicon dioxide.

In one embodiment, contact window masking followed by etching of contact window oxide on front side of wafer 301a is performed. Photolithography is performed on the front surface of wafer 301a using alignment marks created from boron diffusion oxide mask. Contact window mask is a dark field mask, which will be used to remove silicon oxide layer in both n-type, and p-type regions requiring metal contact. Using this mask, one or more contact windows are opened through protective oxide layer deposited on surface of wafer 301a. This procedure may be suitably accomplished by a number of known techniques, such as immersing wafer in a hydrofluoric acid based solution for an interval sufficient to remove layers exposed by contact window mask.

Metallization can be accomplished using any of a number of known approaches, including, for instance, subtractive processes, fully additive processes, and semi-additive processes. Metallization is performed using an assortment of techniques including, but not restricted to, evaporation, sputtering, plating, or electrolytic or electroless. More specifically, semiconductor devices employ metallization primarily to serve at least dual purpose: a) to precise form an electrical contact and b) form an interconnection means within die circuits. Known processes make use of appropriate metals and/or alloys as materials for metallization. For instance, thin-film aluminum is most extensively exploited material for metallization and, due to low resistivity and adhesion compatibility with silicon dioxide, is very suitable for metallization. A disadvantage of aluminum as metallization material is low melting temperature, i.e. 660° C., and low Al—Si eutectic temperature, i.e. 577° C. These restrict the maximum processing temperature once the aluminum layer has been deposited.

Selective metallization procedures for electronic manufacture are known in the art. A process for plasma etching a substrate is disclosed in U.S. Pat. No. 5,053,318. In accordance with the processes of this patent, a suitable substrate, such as an electronic base material, is coated with a radiation-sensitive photoresist composition. The photoresist coating is then pattern imaged. Thereafter, and before development, the surface of the photoresist is contacted with an electroless plating catalyst. The photoresist coating is then contacted with a developer whereby a plating catalyst adsorbed onto developer soluble portions of the coating is removed with solubilized photoresist. Plating catalyst remains on those portions of the coating that are insoluble in developer. This results in formation of a catalytic coating in an image pattern that conforms to the developed photoresist coating. The imaged catalytic coating is then metallized by contact with an electroless plating solution to form a thin metallic layer. The entire article is then subjected to plasma etching. The thin metallic layer functions as an etch barrier whereby the substrate is altered in a reverse image of the metallic layer. The remaining photoresist coating with the metallic layer may then be removed by contact with a photoresist stripper.

In one embodiment, designated areas, confined to front side of wafer 301a around heavily doped 308f and shown in FIG. 3f, are subjected to area-selective metallization process in accord with the principles of the present invention. Area-selective metallization processes are known in the prior art. For instance, European Patent Application No. EP-A 4362000082 titled "Area-selective metallization process" to Cole, Herbert Stanley, Jr. et al. discloses selective electrolytic deposition on either conductive or non-conductive bodies by forming a layer of a metal which forms a plating-preventing compound on the surface of the body to be plated, and selectively interdiffusing a plating-enabling metal into the surface of that compound-forming metal in those locations where plating is desired. The interdiffusion may be done before or after the plating-preventing compound has formed on the surface of the compound-forming layer. During the electroplating, the electroplating metal deposits only in those locations where the plating-enabling metal has interdiffused with the compound-forming metal. At the end of the process, the compound-forming metal may be removed in those locations where it is not covered by the electroplated metal to provide a plurality of separate plated conductors.

Conventional metallization processes for the production of conductive pathways have typically included a metal lift-off lithographic process whereby a photosensitive composition is first coated onto a semiconductor surface. Photosensitive composition is subsequently masked, exposed to radiation, and in due course developed via appropriate physical or chemical process to yield a final pattern of photoresist areas that define locations on semiconductor surface desired to be devoid of metallization.

Subsequent to this photoresist patterning, a metal layer is deposited over both exposed semiconductor surface areas and patterned photoresist areas. To facilitate the final desired metallization pattern, the photoresist is subsequently dissolved, removing with it undesired metal layer, which was deposited on surface of photoresist. Through this indirect metal lift-off process a metal pattern is provided on a semiconductor surface.

One adverse consequence of aforesaid indirect metal lift-off process for semiconductor surface metallizations is production of substantial quantities of residual metal particulate on dissolution of photoresist upon which the metal has been deposited. These metal particles can easily redeposit onto adjoining semiconductor surfaces during lift-off process thereby providing opportunities for voids or other semiconductor device fabrication defects.

An alternative to metal lift-off processes is metal etch process, wherein photolithographic definition of conductive metal pathways occurs by direct patterning of a metal layer that has already been deposited upon a semiconductor surface. More specifically, in this direct method for metal pattern formation, a photoresist is deposited, exposed, and eventually developed upon a previously deposited metal layer to yield a pattern of photoresist features, which define a pattern of metal features to remain on semiconductor surface. The exposed metal remaining between developed photoresist features may then be etched away from the semiconductor surface through an appropriate chemical or physical etch process. Within this direct method for metal pattern formation, there are several choices of direct metal etch processes which are not inherently susceptible to the production of substantial quantities of particulate.

One sophisticated method used to directly etch metals from semiconductor surfaces without particulate formation is a Reactive Ion Etch (RIE) plasma process. Such plasmas are formed within a carefully designed reactor chamber by the exposure of appropriate gases to radio frequency energy. The gases must be chosen with specific consideration to metal desired to be etched. In particular, product obtained from reaction between the gas plasma and metal surface must be sufficiently volatile to be removed from metal surface by reactor system.

FIG. 3g represents a novel photodiode in accordance with the descriptions of the present inventions provided herein. In sum, FIGS. 3a-3g represent a series of manufacturing steps each of which would be appreciated, by one of ordinary skill, to produce a thin film wafer with increased sturdiness and resistance to breakage.

The above discussion is aimed towards providing a preferred embodiment incorporating the novel aspects of the present invention and it should be understood that the foregoing illustration is not the only application where the present invention can be reduced down to practice. The present invention can be suitably modified to incorporate other possible embodiments as well. The scope of the invention is defined solely by the accompanying claims and within the scope of the claims; the present invention can be employed in various other situations.

We claim:

1. A photodiode comprising:
   a substrate with at least a front side and a back side;
   a passivation layer proximate to the front side;
   an active high resistivity layer proximate to said passivation layer comprising at least five regions of alternating conductivity type;
   an n+ deep drive in layer proximate to the active high resistivity layer;
   an anti-reflective layer proximate to said n+ deep drive in layer; and
   a plurality of contact electrodes in electrical communication with each of said five regions of alternating conductivity type;
   wherein the five regions of alternating conductivity type comprises a first n+ region adjacent to a first deep diffused p+ region adjacent to a second n+ region adjacent to a second deep diffused p+ region adjacent to a third n+ region and wherein the five regions of alternating conductivity type comprise a thickness of approximately 40 μm.

2. The photodiode of claim 1 wherein the n+ deep drive in layer comprises a thickness of approximately 40 μm.

3. A photodiode comprising:
   a substrate with at least a front side and a back side;
   a passivation layer proximate to the front side;
   an active high resistivity layer proximate to said passivation layer comprising at least five regions of alternating conductivity type;
   an n+ deep drive in layer proximate to the active high resistivity layer;
   an anti-reflective layer proximate to said n+ deep drive in layer; and
   a plurality of contact electrodes in electrical communication with each of said five regions of alternating conductivity type;
   wherein the five regions of alternating conductivity type comprises a first deep diffused n+ region adjacent to a first deep diffused p+ region adjacent to a second deep diffused n+ region adjacent to a second deep diffused p+ region adjacent to a third deep diffused n+ region and wherein the five regions of alternating conductivity type comprise a thickness of approximately 140 μm to 200 μm.

4. The photodiode of claim 3 wherein the n+ deep drive in layer comprises a thickness of approximately 0.5 μm.

5. The photodiode of claim 3 wherein the n+ deep drive in layer comprises a n+ concentration of approximately $10^{16}$.

6. The photodiode of claim 3 wherein the n+ deep drive-in layer comprises a n+ concentration of approximately $10^{16}$ to $10^{19}$.

* * * * *